(12) United States Patent
Jeong-Sook et al.

(10) Patent No.: US 6,235,618 B1
(45) Date of Patent: May 22, 2001

(54) METHOD FOR FORMING NANOMETER-SIZED SILICON QUANTUM DOTS

(75) Inventors: Ha Jeong-Sook; Park Kang-Ho, both of Taejon; Yun Wan-Soo, Seoul, all of (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 09/441,387

(22) Filed: Nov. 16, 1999

(30) Foreign Application Priority Data

Nov. 17, 1998 (KR) .................................................. 98-49310

(51) Int. Cl.[7] .................................................. H01L 21/425
(52) U.S. Cl. ..................... 438/528; 438/255; 438/398; 438/665; 438/947; 438/962; 117/97
(58) Field of Search ........................ 117/94, 97; 438/17, 438/151, 255, 279, 299, 398, 444, 445, 528, 665, 744, 766, 947, 962

(56) References Cited

U.S. PATENT DOCUMENTS 6,037,243 * 3/2000 Ha et al. .............................. 438/528

* cited by examiner

*Primary Examiner*—Charles Bowers
*Assistant Examiner*—Asok Kumar Sarkar
(74) *Attorney, Agent, or Firm*—Blakely Sokoloff Taylor & Zafman

(57) ABSTRACT

The present invention is related to a method for forming nanometer-sized silicon quantum dots. The method includes the steps of: forming a silicon nitride thin film using active and low energy nitrogen ions on a silicon substrate; forming a uniform silicon thin film on the silicon nitride thin film by a silicon vapor deposition technique; forming silicon nitride islands by injecting a nitrogen gas; forming silicon quantum dots covered with the silicon nitride islands by etching silicon thin film, not covered with the silicon nitride thin film, by injecting an oxygen gas; eliminating the silicon nitride thin film covering the silicon quantum dots by using reactive ions.

10 Claims, 2 Drawing Sheets

METHOD FOR FORMING NANOMETER-SIZED SILICON QUANTUM DOTS

FIELD OF THE INVENTION

The present invention relates to a method for forming nanometer-sized silicon quantum dots; and, more particularly, to a method for forming electronically separated and nanometer-sized silicon quantum dots on a silicon substrate covered with a silicon nitride thin film by using a surface chemical reaction technique.

DESCRIPTION OF THE PRIOR ART

Recently, there is a demand for the miniaturization of a semiconductor device and it is necessary to improve on a nanostructural technology to achieve low cost, high efficiency and high purity. A conventional method for forming nanometer-sized silicon quantum dots is using high-energy electron beams for patterning. However, it is expensive and takes long processing time to make silicon quantum dots by using high-energy electron beams.

SUMMARY OF THE INVENTION

It is, therefore, an object of the present invention to provide a method for forming electrically separated and highly pure silicon quantum dots on a silicon substrate covered with a silicon nitride thin film by using surface chemical reaction technique to minimize problems caused by the conventional method.

In accordance with an aspect of the present invention, there is provided a method for forming silicon quantum dots by using uniformly sized and distributed nanometer-sized silicon nitride islands as a mask against an oxygen gas, under vacuum conditions to eliminate any impurities in all processes. First, using low energy nitrogen ion beams, a silicon nitride thin film is formed. On the top of the silicon nitride thin film, silicon thin film in few nanometer thick is formed by using a silicon vapor deposition technique. Then the surface of the silicon substrate is reacted with a nitrogen gas to form silicon nitride islands, few to tens of nanometer in size and single-layered in thickness, while maintaining the surface at about 800° C. Since silicon nitride is not reactive with an oxygen gas, the silicon nitride islands are used as a mask against an oxygen gas. The surface of the silicon substrate is heated to 700° C. and the oxygen gas is injected to etch the silicon thin film selectively, not the portion covered with the silicon nitride islands. Therefore, the silicon quantum dots in thin film thickness can be formed by using the surface chemical reaction technique.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

This section will describe the present invention in detail with reference to the accompanying drawings.

FIG. 1 illustrates processes of forming nanometer-sized silicon quantum dots. FIG. 1A shows the process of forming a silicon nitride thin film and FIG. 1B shows the process of forming a silicon thin film by a silicon vapor deposition technique. FIG. 1C shows the process of forming single-layered silicon nitride islands, few to tens of nanometers in size. FIG. 1D shows the process of forming the silicon quantum dots capped with the silicon nitride islands, few to tens of nanometers in size. And finally, FIG. 1E shows the finishing process of the silicon quantum dots, few to tens of nanometers in size. All the processes are performed under $10^{-10}$ Torr as a base pressure and each of the detailed processes will be described hereinafter.

Figure 1A:
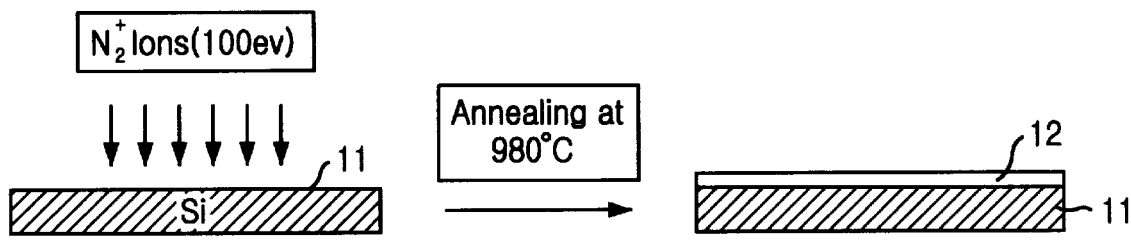
FIGS. 1A to 1E show forming processes of nanometer-sized silicon quantum dots in accordance with the present invention.

Referring to FIG. 1A, the upper surface of a silicon substrate (11) is heated to 1230° C. for tens of seconds and cooled down to a room temperature. By repeating this process several times the surface is cleaned in atomic level. Then low energy $N_2^+$ ions (~100 eV) are injected on the silicon substrate (11) by using an ion gun. The silicon substrate is annealed at 980° C. for several minutes so that a silicon nitride thin film (12) can be formed on the silicon substrate (11) for a surface deactivation.

Figure 1B:
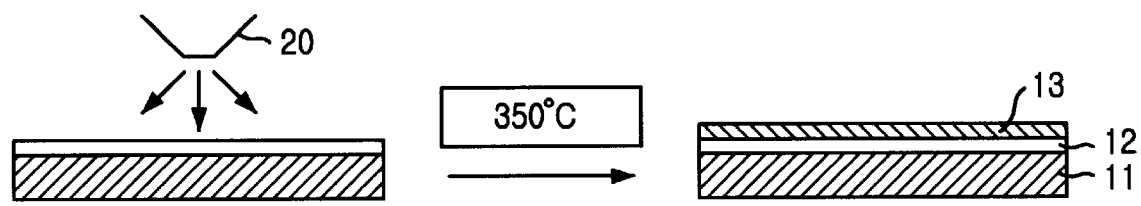
Figure 1C:
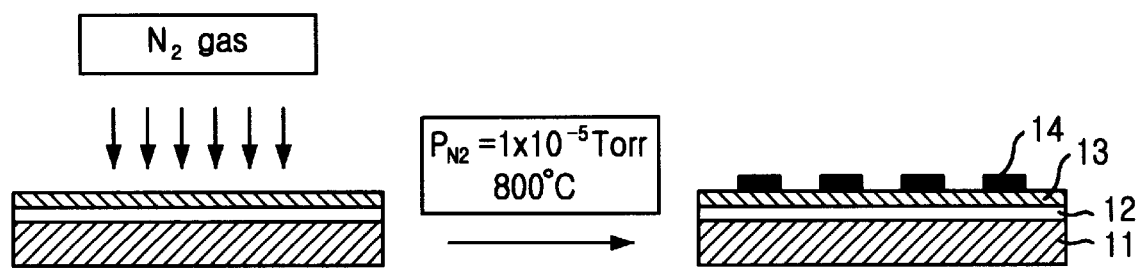

As shown in FIG. 1B, a silicon evaporator is heated to about 1300° C. in order to evaporate silicon gas in the silicon evaporator. Then the silicon substrate having the silicon nitride thin film formed thereon, maintaining about 350° C., comes close to the evaporator to form a silicon thin film (13) on top of the silicon nitride thin film (12). After the formation of the silicon nitride thin film (12) and the silicon thin film (13) on the silicon substrate (11), the resultant silicon substrate is heated to 800° C. and a nitrogen gas with a partial pressure of $1 \times 10^{-5}$ Torr is injected to form silicon nitride islands with a uniform size distribution as shown FIG. 1C.

The next process is an injection of an oxygen gas ($O_2$) under a partial pressure ($P_{O2}$) of $1 \times 10^{-7}$ Torr on the silicon substrate to form silicon quantum dots, few to tens of nanometer in size. In this process the silicon substrate is maintained at 700° C. Then the oxygen gas reacts with the silicon thin film (13) only, not the silicon nitride islands (14), for etching ($Si + O_2 \rightarrow SiO(\uparrow)$). This reaction does not affect the silicon thin film portion with the silicon nitride islands. Through these processes the silicon quantum dots, with few to tens of nanometer in size and thin film depth in height, are formed.

Figure 1D:
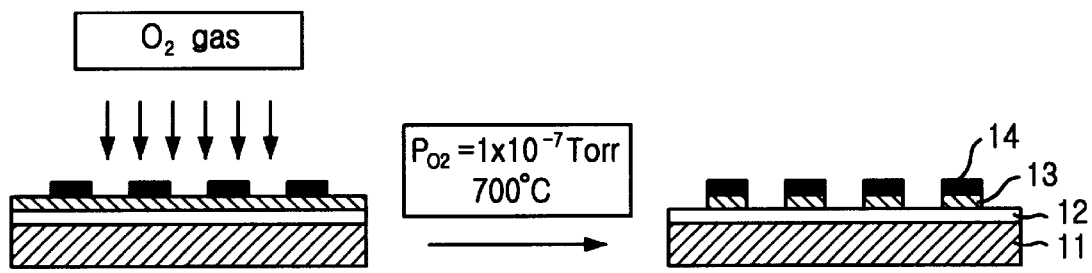
Figure 1E:
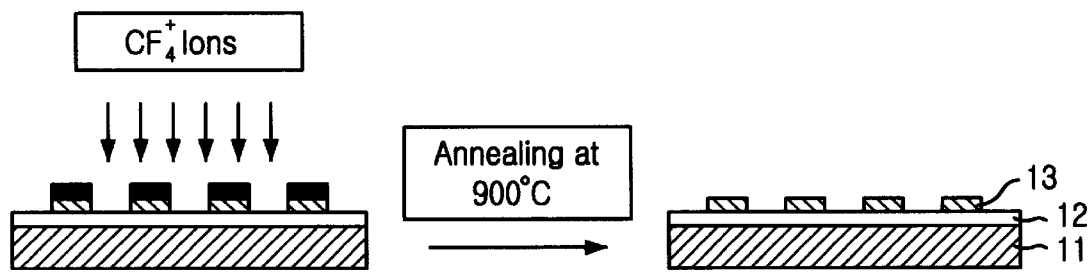

After the formation of the silicon quantum dots (13) covered with the silicon nitride islands, the final process is an elimination of the silicon nitride islands (14). As shown in FIG. 1E, the surface of the silicon substrate from the FIG. 1D is injected with $CF_4^+$ ions of the energy of 100~200 eV to eliminate the silicon nitride islands. Then the silicon substrate is annealed at 900° C. to recover the surface of the silicon substrate in atomic level.

The present invention to form the nanometer-sized silicon quantum dots uses the surface chemical reaction technique. Therefore, this invention can effectively decrease the cost and the processing time. It can also be expected to manufacture a structure with very high purity and electrically separated and nanometer-sized silicon quantum dots. Another advantage of this process is that the height of the silicon quantum dots can be uniformly formed on the silicon substrate since the deposition is done by using a silicon vapor deposition technique and the etching is done selectively by using the oxygen gas. Therefore, this invention can be easily applied to the manufacturing of a nanometer sized semiconductor device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a nanometer-sized silicon quantum dots on a silicon substrate, comprising the steps of:
   (a) forming a silicon nitride thin film by injecting active and low energy nitrogen ions on the silicon substrate;
   (b) forming a silicon thin film, few to tens of nanometer in thickness, on the silicon nitride thin film by using a silicon vapor deposition technique;
   (c) forming evenly distributed silicon nitride islands with few to tens of nanometers in size on the silicon thin film;
   (d) forming silicon quantum dots covered with the silicon nitride islands by injecting an oxygen gas to etch the silicon thin film, not covered with the silicon nitride thin film; and
   (e) forming the nanometer-sized silicon quantum dots by eliminating the silicon nitride islands by using reactive ions.

2. The method as recited in claim 1, wherein said step (a) includes the steps of;
   (a1) injecting nitrogen ions of 100 eV on the silicon substrate; and
   (a2) annealing the resultant silicon substrate from the step (a1) at 980° C. for a predetermined time.

3. The method as recited in claim 1, wherein said step (b) includes the steps of;
   (b1) heating a silicon evaporator to about 1300° C.; and
   (b2) moving the silicon nitride thin film close to the silicon evaporator for a silicon vapor deposition.

4. The method as recited in claim 1, wherein said step (c) includes the steps of;
   (c1) injecting a nitrogen gas with a partial pressure of $1\times10^{-5}$ Torr on the silicon thin film at 800° C.; and
   (c2) forming the silicon nitride islands, about 0.3 nm in height on the silicon thin film.

5. The method as recited in claim 1, wherein said step (d) includes the steps of;
   (d1) injecting the oxygen gas with a partial pressure of $1\times10^{-7}$ Torr at 700° C.; and
   (d2) etching the silicon thin film not covered with the silicon nitride islands to thereby form the silicon quantum dots covered with the silicon nitride islands.

6. The method as recited in claim 1, wherein said step (e) includes the steps of;
   (e1) injecting $CF^{4+}$ ions of 100~200 eV to eliminate the silicon nitride islands covering the silicon quantum dots; and
   (e2) annealing at 900° C. to recover a defected silicon surface in atomic level.

7. The method as recited in claim 2 wherein said step (b) includes the steps of;
   (b1) heating silicon evaporator to about 1300° C.; and
   (b2) moving the silicon nitride thin film close to the silicon evaporator for the silicon vapor deposition technique.

8. The method as recited in claim 7, wherein said step (c) includes the steps of;
   (c1) injecting nitrogen gas with a partial pressure of $1\times10^{-5}$ Torr on the silicon thin film at 800° C.; and
   (c2) forming the silicon nitride islands, about 0.3 nm in height on the silicon thin film.

9. The method as recited in claim 8, wherein said step (d) includes the steps of;
   (d1) injecting oxygen gas with a partial pressure of $1\times10^{-7}$ Torr at 700° C.; and
   (d2) etching the silicon thin film not covered with the silicon nitride islands to thereby form the silicon quantum dots covered with the silicon nitride islands.

10. The method as recited in claim 9, wherein said step (e) includes the steps of;
    (e1) injecting $CF^{4+}$ ions of 100~200 eV to eliminate the silicon nitride islands covering the silicon quantum dots; and
    (e2) annealing at 900° C. to recover a defected silicon surface in atomic level.

* * * * *